(12) United States Patent
Moltion

(10) Patent No.: US 7,703,197 B2
(45) Date of Patent: Apr. 27, 2010

(54) PROCESS FOR DEPOPULATING A CIRCUIT BOARD

(76) Inventor: James R. Moltion, 2944 Route 11, LaFayette, NY (US) 13084

( * ) Notice: Subject to any disclaimer, the term of this patent is extended or adjusted under 35 U.S.C. 154(b) by 625 days.

(21) Appl. No.: 11/174,182

(22) Filed: Jul. 1, 2005

(65) Prior Publication Data
US 2007/0004290 A1    Jan. 4, 2007

(51) Int. Cl.
 *B23P 19/00* (2006.01)
(52) U.S. Cl. .................. 29/762; 29/403.2; 29/426.3; 29/426.5; 219/85.13; 219/411; 228/191; 228/264
(58) Field of Classification Search ........... 29/403.2, 29/426.1, 426.3, 426.5, 762; 219/391, 411, 219/85.3, 85.13; 228/1.1, 49.5, 119, 191, 228/264; 261/46.017, 779.1
See application file for complete search history.

(56) References Cited

U.S. PATENT DOCUMENTS

| 4,020,992 | A |   | 5/1977 | Binger et al. |
| 4,270,260 | A | * | 6/1981 | Krueger ............... 29/403.4 |
| 4,654,502 | A | * | 3/1987 | Furtek ................. 219/85.13 |
| 5,128,506 | A | * | 7/1992 | Dahne et al. .......... 219/85.13 |
| 5,139,203 | A |   | 8/1992 | Alavi |
| 5,217,171 | A |   | 6/1993 | Feldman |
| 5,375,318 | A |   | 12/1994 | Catalano |
| 5,456,738 | A |   | 10/1995 | Gil |
| 5,547,134 | A | * | 8/1996 | Rubenstein ............ 241/23 |
| 5,552,579 | A | * | 9/1996 | Krueger ............... 219/411 |
| 5,667,156 | A |   | 9/1997 | Chapman |
| 5,676,318 | A |   | 10/1997 | Yokoyama et al. |
| 5,678,775 | A |   | 10/1997 | Chapman |
| 5,683,040 | A |   | 11/1997 | Jakob et al. |
| 5,743,936 | A |   | 4/1998 | Yokoyama et al. |
| 5,758,817 | A |   | 6/1998 | Chapman |
| 5,759,416 | A |   | 6/1998 | Bosman et al. |
| 5,788,167 | A |   | 8/1998 | Chapman |
| 5,829,694 | A |   | 11/1998 | Chapman |
| 5,843,287 | A |   | 12/1998 | Wicks et al. |
| 5,887,805 | A |   | 3/1999 | Chapman |
| 5,979,033 | A |   | 11/1999 | Chang et al. |
| 6,300,402 | B1 |   | 10/2001 | Chapman |
| 6,685,116 | B1 |   | 2/2004 | Hisazumi et al. |
| 6,776,324 | B2 | * | 8/2004 | Morita ................ 228/1.1 |
| 6,776,325 | B2 | * | 8/2004 | Yang ................. 228/49.5 |
| 6,820,829 | B1 |   | 11/2004 | Oder et al. |
| 6,986,192 | B2 |   | 1/2006 | Fitch |

OTHER PUBLICATIONS

Chodak, Adam, http://www.news10now.com/content/top_stories/default.asp?ArID=37485&addvid=2113, 2,2005.
S. Yokomaya et al., "Recycling of Printed Wiring Board Waste," Proceeding of the 1993 IEEE/Tsukuba International Workshop on Advanced Robotics, Nov. 8-9, 1993, pp. 55-58.

* cited by examiner

*Primary Examiner*—Donghai D. Nguyen

(57) ABSTRACT

Apparatus and methods for removing components from a circuit board. A conveyor transports circuit boards having components attached with solder through a heating section. When the solder has been melted by application of electromagnetic radiation, the circuit board is subjected to mechanical forces that dislodge the components to be removed from the circuit board. In one embodiment, the electromagnetic radiation is supplied by heaters operating at color temperatures in the vicinity of 973 Kelvin. The components are recovered in a form that allows their reuse.

6 Claims, 11 Drawing Sheets

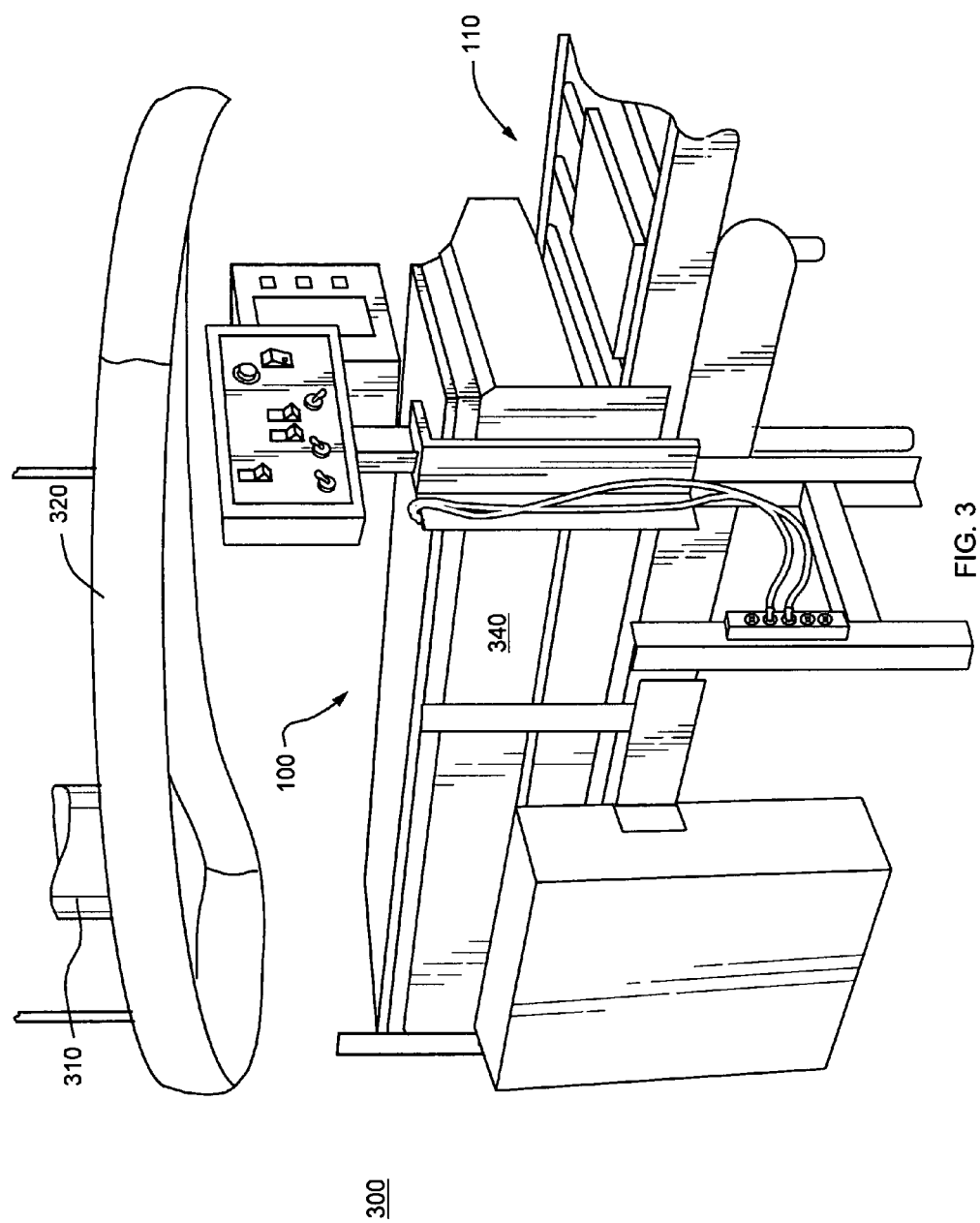

PROCESS FOR DEPOPULATING A CIRCUIT BOARD

FIELD OF THE INVENTION

The invention relates to systems and methods for recovery of used components in general and particularly to systems and methods that recover used components and that are environmentally friendly.

BACKGROUND OF THE INVENTION

Disposal of used electronic equipment, parts, and components, including obsolete or damaged computers, computer monitors, television receivers, cellular telephones, and similar products, is increasing at a rapid rate. It is recognized that there are significant hazards to living things and to the environment generally when electronic equipment is dumped in landfills. Equally, it is understood that improper disassembly poses appreciable risks to the health and safety of people performing disassembly manually.

There are known systems and methods for recovering materials from printed circuit boards, including disassembling circuit boards, for example as described in U.S. Pat. No. 5,758,817 issued Jun. 2, 1998 to Chapman (hereinafter "the '817 patent"), and including crushing or otherwise breaking circuit boards into fine particles, for example as described in U.S. Pat. No. 5,667,156 issued Sep. 16, 1997 to Chapman (hereinafter "the '156 patent").

As described in the '817 patent, an automated system is disclosed that employs radiant heating unit(s) positioned beneath printed wiring assemblies ("PWA's") that are transported through the disassembly apparatus. In addition, some preferred embodiments described in the '817 patent use a photo sensor and two PWA vibrating plunging devices. The photo sensor detects the approaching PWA. These sensors may be placed in a way that provides an option to detect either the leading or the trailing edge of the boards as they are transported. When a PWA passes under the photo sensor, a de-population circuit control module activates a vibrating plunger device. The plunger of a vibrating plunger device strikes a selected place on a Printed Wiring Board (PWB) of a PWA, such as the back, uppermost portion of a PWB once the solder holding electrical components reaches its melt-flow temperature. Vibrating plunging devices then vibrate a PWA at the appropriate time in the appropriate position to create a vibration, which causes electrical components to drop or fall off of the PWB.

The '156 patent describes that use of a plurality of crushing machines and conveyors to reduce PWAs and PWBs to particulate material. The PWAs or PWBs are rendered into three fractions, described as (A) a granular form of the metallic constituent that allows reproducible and reliable chemical analysis of its elemental composition and permits efficient reclamation of the precious elements through subsequent refining processes; (B) a finely ground form of non-metallic PWB base material, generally comprising fiberglass and epoxy or polyimide resin, a "fines" fraction; and (C) an extremely finely ground form of non-metallic dust generally comprising the fiberglass and binding resins from the PWB base. The '156 patent teaches that these fractions can be reclaimed or recycled.

There is a need for systems and methods that allow the recovery in an environmentally friendly way of components, precious materials, and also energy from discarded electronic components such as printed circuit boards.

SUMMARY OF THE INVENTION

In one aspect, the invention relates to an apparatus for removing an item soldered to a printed circuit board. The apparatus comprises a transport mechanism configured to carry a printed circuit board from a printed circuit board entry port of the apparatus to a printed circuit board exit port of the apparatus; a speed control coupled to the transport mechanism to control a travel speed of the printed circuit board; a heat source configured to heat solder at a higher heating rate than the rate of heating applied to a board component of the printed circuit board; a heat source control coupled to the heat source to control a rate of heating of solder; a vibrator configured to apply mechanical forces to the printed circuit board situated between the printed circuit board entry port of the apparatus and the printed circuit board exit port of the apparatus; a vibrator control to control an amplitude of the mechanical forces applied to the printed circuit board; and an inclined surface configured to catch at least one item that becomes disconnected from the printed circuit board and to transport to a first collection location the disconnected item under the influence of gravity. A printed circuit board bearing an item soldered thereto can be separated from the item when the printed circuit board bearing the item is transported from the entry port to the exit port under conditions of being heated and being mechanically vibrated.

In one embodiment, the apparatus further comprises a transport mechanism configured to carry the at least one item that becomes disconnected from the printed circuit board from the first collection location to a second collection location. In one embodiment, the speed control is configured to control the travel speed of a printed circuit board within the range of 1 to 48 inches per minute. In one embodiment, the heat source is an infrared heat source.

In one embodiment, the heat source is configured to operate at approximately 9000 watts power, for example using three phase electrical power at 208 volts alternating current. However suitable systems can be designed for operation on single or three phase at any convenient voltage at 9000 watts.

In one embodiment, the heat source is configured to operate at a color temperature of approximately 1300 degrees Fahrenheit. 1300 degrees Fahrenheit is approximately equivalent to 700 degrees Centigrade, or 973 Kelvins (absolute temperature).

In one embodiment, the heat source control is configured to control the heating rate of solder within the range of 100 to 800 degrees F. per minute In one embodiment, the vibrator configured to apply mechanical forces to the printed circuit board is configured to apply a force sufficient to change a velocity of the printed circuit board by approximately 2.6 inches per second. In one embodiment, the vibrator configured to apply mechanical forces to the printed circuit board is configured to apply the forces in a direction parallel to a gravitational force.

In one embodiment, the item soldered to a printed circuit board is a selected one of a semiconductor, a resistor, a capacitor, a connector, and a chip carrier.

In one embodiment, the item soldered to a printed circuit board is a selected one of an item comprises leads and a surface-mounted item.

In another aspect, the invention features a method of removing an item soldered to a printed circuit board. The method comprises the steps of transporting a printed circuit board from a printed circuit board entry port to a printed circuit board exit port of an apparatus configured to remove the item; controlling a travel speed of the printed circuit board; heating solder at a higher heating rate than the rate of heating applied to a board component of the printed circuit board; applying mechanical forces to the printed circuit board situated between the printed circuit board entry port and the printed circuit board exit port of the apparatus; controlling an amplitude of the mechanical forces applied to the printed circuit board; catching at least one item that becomes disconnected from the printed circuit board; and transporting to a first collection location the disconnected item under the influence of gravity. A printed circuit board bearing an item soldered thereto is separated from the item when the printed circuit board bearing the item is transported from the entry port to the exit port under conditions of being heated and being mechanically vibrated.

In one embodiment, the method further comprises the step of carrying the at least one item that becomes disconnected from the printed circuit board from the first collection location to a second collection location.

In one embodiment, the travel speed of a printed circuit board is controlled within the range of 1 to 48 inches per minute.

In one embodiment, the step of heating solder is accomplished with an infrared heat source.

In one embodiment, the step of heating solder is accomplished with a heat source operating at approximately 9000 watts power, for example using three phase electrical power at 208 volts alternating current.

In one embodiment, the step of heating solder is accomplished with a heat source operating at a color temperature of approximately 1300 degrees Fahrenheit.

In one embodiment, the heating rate of solder is controlled within the range of 100 to 800 degrees Fahrenheit per minute.

In one embodiment, the step of applying mechanical forces to the printed circuit board comprises applying a force sufficient to change a velocity of the printed circuit board by approximately 2.6 inches per second.

In one embodiment, the step of applying mechanical forces to the printed circuit board comprises applying the forces in a direction parallel to a gravitational force.

In one embodiment, the item soldered to a printed circuit board is a selected one of a semiconductor, a resistor, a capacitor, a connector, and a chip carrier.

In one embodiment, the item soldered to a printed circuit board is a selected one of an item comprises leads and a surface-mounted item.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 3 is a perspective side view of an exemplary embodiment of a circuit board depopulation apparatus, according to the invention;

DETAILED DESCRIPTION OF THE INVENTION

Figure 1:
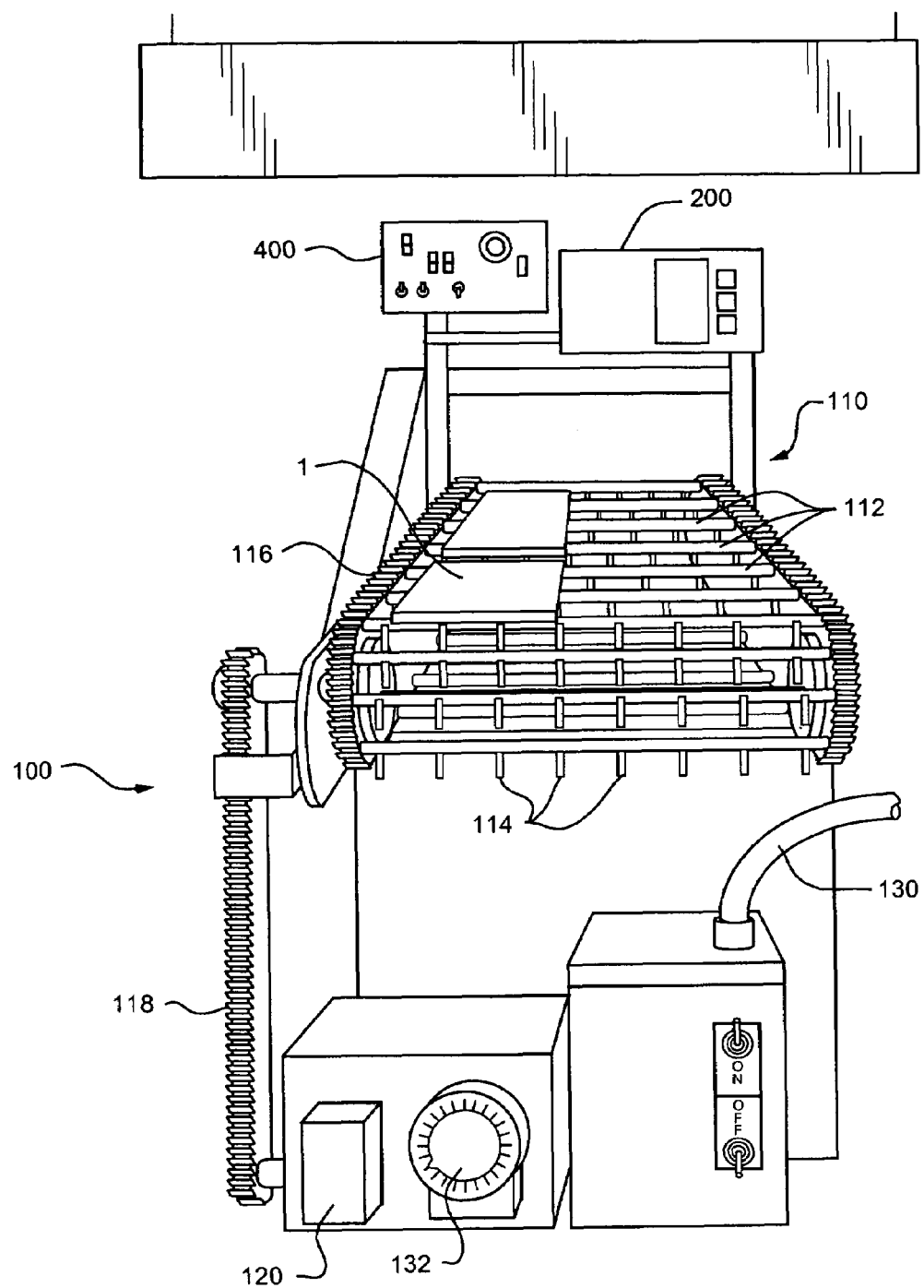
FIG. 1 is an elevation view of the input portion of an exemplary embodiment of a circuit board depopulation apparatus, according to the invention.

The present invention provides systems and methods for the efficient, environmentally friendly, and safe disassembly of certain kinds of electronic materials that have been rendered obsolete or are damaged, including the depopulation of circuit boards, the recovery of valuable materials as both reusable electronic components and as valuable substances such as metals, including precious metals, and the recovery of energy used to manufacture some of the materials.

Aspects of the invention are embodied in systems and methods useful to recover wealth from scrap circuit boards. In the first phase of the recovery process, the boards are fed into a parts removal system. The system can process a complete computer motherboard in approximately 8 to 12 seconds. In one embodiment, the system is automated and is continuous, processing up to 1,000 boards per an eight-hour workday. Since the number of boards processed is defined by a linear traverse rate times a board size, about 1400-1600 boards can be processed in one 8 hour shift under ideal conditions using current operating conditions. The number of boards will vary depending on the size of the boards. This unique process does not damage the parts. The surface mount or "through the hole" parts are completely recoverable with minor lead straightening and re-tining, and are ready for use in production again. A single line of the depopulation system has the capacity to produce over 300,000 usable parts per workweek, based on an average count of all available parts derived from counting parts from 50 unlike boards. It is contemplated that an automated sorter that can count and inventory these parts automatically can be used with the depopulation apparatus. For example, the automated sorter can use neural network pattern recognition and OCR to identify parts by shape and/or by markings thereon.

Once the boards are depopulated, the boards and other materials that are deemed damaged or unusable are fed through size reduction equipment. The boards and other materials are reduced to a consistent, finely powdered material. The particle sizes can be as small as from 2 to 6 microns. This powder contains all the components that make up the boards, including all the metals and fiberglass substrate. This powder is then introduced into a separator/classifier, which is a fluid-based system using water as the carrier throughout the process. The system is designed as a closed loop system and no wastewater is generated. When the water becomes saturated, it is removed and sent to an evaporator where the dissolved materials are recovered.

In a further phase, the magnetic or ferrous metals are removed and the now powdered metals are further cleansed of all class II metals, which cannot be submitted to smelters for final processing. The fiberglass board, ceramic, and plastic material are safe to be placed in a land fill.

Characterization has been performed on several pounds of ground computer motherboard material using various sample sizes, acid extraction mixtures, and extraction conditions. A microwave digestion with aqua regia yields maximum concentrations as follows: Cu 240 mg/g, Al 11 mg/g, Pb 11 mg/g, Au 0.03 mg/g, Zn 9 mg/g, and Ti 0.8 mg/g.

At the present time, testing has not determined analytical values for Ni and Ta. Analysis of an aqueous extract of the "plastic" portion of commercially available computers to determine whether the plastic may be considered a hazardous waste provided the following extraction values: 0.47 ppm Ba, 0.20 ppm Al, 0.03 ppm Cu, 0.75 ppm Mg, no reportable Pb, As, Zn, Ti, Nb, Ta, Cr, Cd, Se, Aq, or Hg. It is recognized that Al, Mg and Cu aren't hazardous materials.

An alternative use is to sell this byproduct for application as a lightweight aggregate, for example for the building materials industry.

In some embodiments, reactive metals may be chemically treated to produce fuels, such as hydrogen.

The complete system is designed to be energy efficient, non-labor intensive, highly productive and environmentally safe.

FIG. 1 is an elevation view of the input portion of an exemplary embodiment of a circuit board depopulation apparatus 100. FIG. 1 shows a conveyor 110 upon which is resting a circuit board 1 that is intended to be depopulated. The end of circuit board depopulation apparatus 100 shown in FIG. 1 is an entry port of the apparatus. The conveyor 110 in the embodiment shown has a plurality of support rods 112 that are generally oriented in a direction transverse to the direction of motion of the circuit board 1 during the depopulation operation. As shown in FIG. 1, the circuit board 1 is moved in a direction generally away from the viewer during the depopulation process. As may be seen in FIG. 1 conveyor 110 has appreciable open space between successive support rods 112, so that mechanical forces can be applied to circuit board 1 by actuators that move in synchrony with the conveyor 110, and which pass between the support rods 112 of conveyor 112. Also visible in FIG. 1 are a plurality of support tubes or fingers 114 that are oriented in a substantially orthogonal direction to support rods 112, and which can be oriented to support an object such as circuit board 1 with appreciably smaller contact area than that contact area that would obtain if circuit board 1 rested directly on the support rods 112. The conveyor 110 may conveniently be driven using a drive such as chain drive 116, comprising a chain 116 on at least one side of conveyor 110, which chain 116 is driven using a motor such as electric motor 120 that drives the one or more chains 116 by any convenient means, such as an intermediate chain drive 118 that allows the rate of rotation of the motor 120 and the rate of advance of the conveyor 110 to be set in suitable relative proportions using gears having various ratios. Power is brought into the apparatus by wires in conduit 130, and variable transformer 132 permits voltage adjustments as may be needed. Also seen in FIG. 1 are two control panels, heater control panel 200, and control panel 400, both of which are described in greater detail hereinafter.

Figure 2:
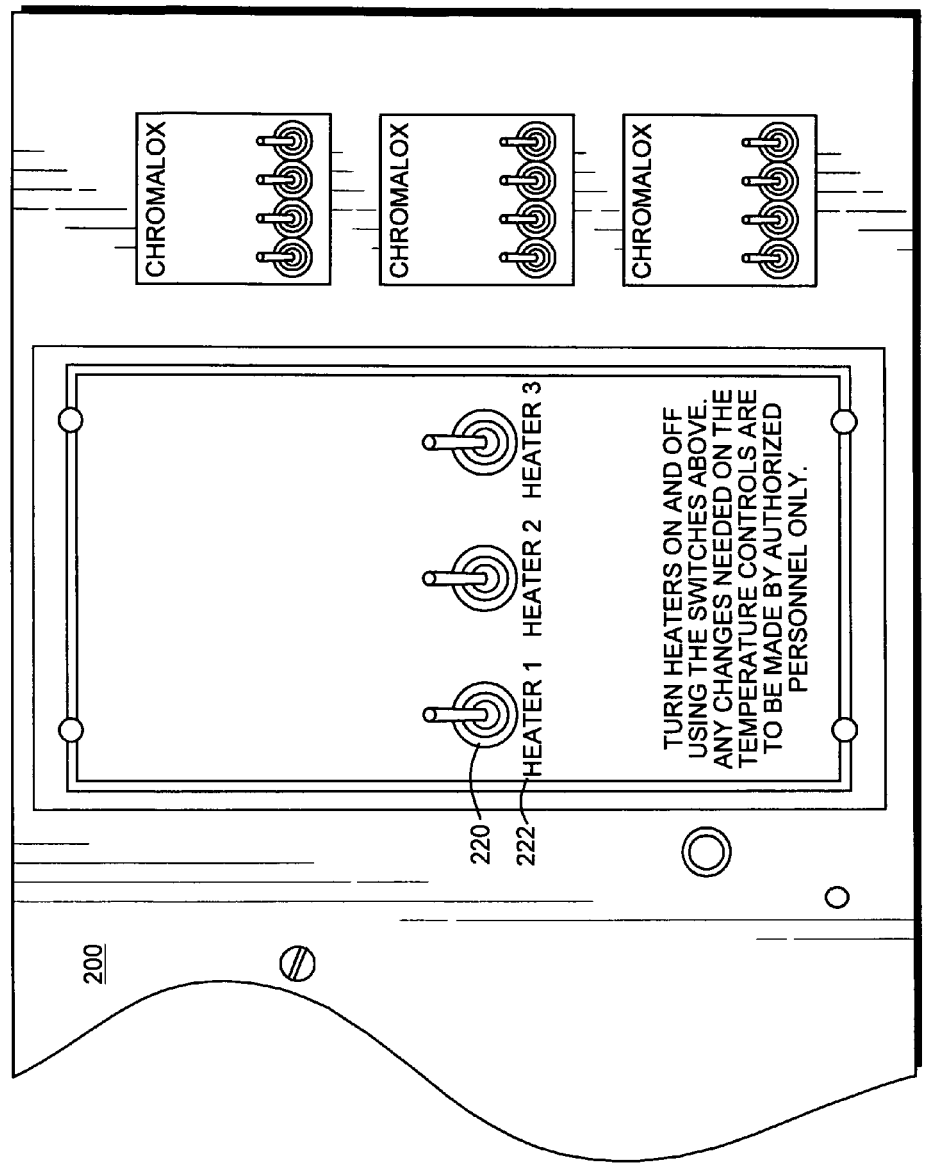
FIG. 2 is a view of an exemplary embodiment of a control panel used for controlling a plurality of heating elements of a circuit board depopulation apparatus, according to the invention.

FIG. 2 is a view of an exemplary embodiment of a control panel 200 used for controlling a plurality of heating elements of the circuit board depopulation apparatus 100. In the embodiment shown, the control panel comprises the circuitry required to control three separate heaters. Each heater is controlled using a temperature controller 210, 212, 214 of conventional type, and a respective on-off switch 220, 222, 224. The temperature controllers 210, 212, 214 are commercially available from many vendors. Solder commonly used on printed circuit boards melts at approximately 360-400 degrees F. The efficiency of the heaters, the rate of speed of the conveyor, and rates of heat energy absorption will affect the rate of heating. In operation according to the present invention, the heaters are operated at a color temperature of approximately 1300 degrees Fahrenheit. This temperature is approximately equivalent to 700 degrees Centigrade, or 973 Kelvins (absolute temperature). One can compute the optical emission spectrum for a heater operating at 973 K using the Planck radiation law and the Stephan-Boltzmann equation.

As explained in the Encyclopedia Britannica, Planck's law for the energy $E\lambda$ radiated per unit volume by a cavity of a blackbody in the wavelength interval $\lambda$ to $\lambda+\Delta\lambda$ ($\Delta\lambda$ denotes an increment of wavelength) can be written in terms of Planck's constant (h), the speed of light (c), the Boltzmann constant (k), and the absolute temperature (T):

$$E_\lambda = \frac{8\pi hc}{\lambda^5} \times \frac{1}{\exp(hc/kT\lambda) - 1}.$$

The wavelength of the emitted radiation is inversely proportional to its frequency, or $\lambda=c/v$. The value of Planck's constant is found to be $6.6260755 \times 10^{-34}$ joule-second.

The Stephan-Boltzmann law states that the total radiant-heat energy emitted from a blackbody surface is proportional to the fourth power of its absolute temperature. If E is the radiant heat energy emitted from a unit area in one second and T is the absolute temperature (in degrees Kelvin), then $E=\sigma T^4$, the symbol a representing the constant of proportionality, called the Stefan-Boltzmann constant, having the value $1.36 \times 10^{-4}$ kilocalories per meter$^2$-second-K$^4$. Complete discussions of heating and cooling by electromagnetic radiation are presented in numerous textbooks, including *Principles of Heat Transfer* by Frank Krieth and Mark S. Bohn, published in 1999.

In the embodiment shown in FIG. 2, plastic tape has been used to cover the buttons used to program the controllers 210, 212, 214, so as to discourage untrained users of the circuit board depopulation apparatus (e.g., technicians) from changing the programmed settings. In more sophisticated apparatus, settings can be provided by remote communication methods, such as communicating over networks, or can be made available by password protected devices such as personal computers, so that unauthorized persons cannot make changes to the programmed settings, data, process step sequences, and the like. While the first embodiment of the invention relies heavily on manually operated equipment, it is contemplated that later embodiments of the apparatus of the invention will employ general purpose computers programmed with software (e.g., computer instructions in the form of programs recorded on machine readable media) to the purposes of controlling the operation of the apparatus and for precisely defining operating parameters in accordance with the types of circuit boards to be processed. In FIG. 2, under the conditions that prevailed at the time the system was being observed, each of the temperature controllers was indicating that a respective heater was operating at a temperature close to 700 degrees Fahrenheit. The individual heater temperatures can be measured using any convenient method, including for example a thermocouple, an electromagnetic radiation monitor such as an optical pyrometer, a thermistor, and a power meter.

In addition to controlling the operation of the circuit board depopulation apparatus 100 by computer, various other computer-based monitoring systems can be used with the circuit board depopulation apparatus 100. For example, a digital counter using a low power laser and optical detector or another optical vision system can count the boards processed and can transmit the statistics for storage and analysis. The data collection system can employ a microcontroller-based digital system to monitor all the function of the circuit board depopulation apparatus 100. The data collection system allows collection of statistics over time as well as permitting an operator to monitor the instantaneous operation of the system.

FIG. 3 is a perspective side view 300 of an exemplary embodiment of the circuit board depopulation apparatus 100. The perspective view includes the elements previously described hereinabove with respect to FIGS. 1 and 2, and additionally shows a vent 310 having a hood 320 situated generally above the conveyor 110, and connected to an exhaust pump for removing fumes generated in heating circuit boards. FIG. 3 also shows the location of heaters situated within a housing 340 through which the conveyor 110 passes, and through which circuit boards are transported during the depopulation process. In the embodiment shown, there are three heaters situated in a linear array oriented substantially along the transport direction of the conveyor 110.

Figure 3A:
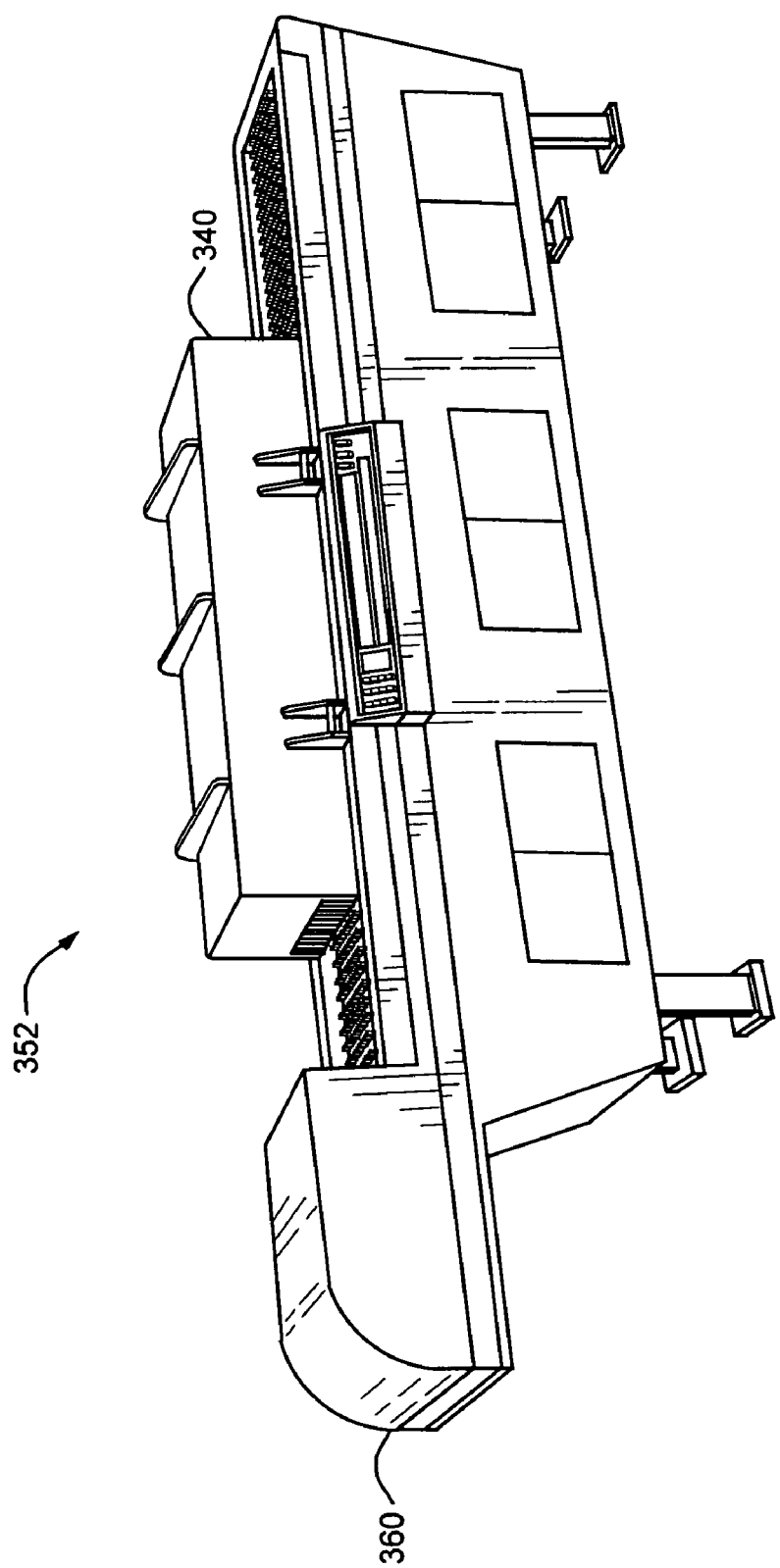
FIG. 3A is a drawing of an alternative embodiment of the circuit board depopulation apparatus, according to the invention.

In the present embodiment, three infrared heaters operating at substantially a 1300 degree Fahrenheit color temperature are used to heat the materials passed through the circuit board depopulation apparatus 100. However, in different embodiments, one can use fewer than three heaters or more than three heaters, for example to tailor a thermal profile and/or to accommodate different linear traverse speeds and corresponding heating zone lengths. In operation, it has been observed that the infrared heaters impart enough energy to melt the solder holding components to circuit boards, but do not impart sufficient thermal or radiant energy at wavelengths that are readily absorbed by the circuit boards themselves, resulting in the depopulation of circuit boards without excessive heating of the boards. It has been observed that, although the solder has melted sufficiently to leave the circuit boards depopulated and clean (e.g., has reached a temperature of approximately 360-460 degrees Fahrenheit (ca. 180-240 degrees Centigrade), the boards themselves exit the circuit board depopulation apparatus 100 at a temperature that is merely warm to the touch, and can be grasped with a bare hand. FIG. 3A is a drawing 352 of an alternative embodiment of the circuit board depopulation apparatus. In one embodiment, the heaters are NESM-1 heaters, manufactured by Solar Products, Inc, 228 Wanaque Avenue, Pompton Lakes, N.J. 07442, and operated at 15.4 amps and 208 AC volts. In some embodiments, the heating elements are contained and insulated to provide a more constant temperature. In some embodiments, such as that of FIG. 3A, the housing 340 that covers the heaters is hinged to allow access within the oven area, in order to permit servicing, maintenance, and repairs as necessary. The hinged housing 340 includes a safety interlock to prevent inadvertent operation of the heaters when the housing 340 is opened. In the embodiment of FIG. 3A, depopulated printed circuit boards exit at the left end 360 of the apparatus, and the parts removed from the depopulated printed circuit boards exit on the side of the apparatus not seen in FIG. 3A.

In FIG. 3, the housing 340 portion of the circuit board depopulation apparatus 100 also contains one or more mechanical impact devices 360 that impart a vertical mechanical impact, and vertical motion, to a circuit board. The impact, and consequent vertical motion, can be applied during the time that the circuit board is being heated by the heaters 350, 352, 254. The one or more mechanical impact devices 360 can apply a force sufficient to change a velocity of a circuit board by at least 2.6 feet per second. In one embodiment, the circuit board it forced to move upward, comes to a stop and falls at a velocity of approximately 1.3 feet per second. The more mechanical impact devices 360 supply sufficient force to cause the circuit board to reverse direction (from falling to rising) at substantially a velocity of 1.3 feet per second. Because circuit components held to the circuit board with solder are traveling in a downward direction (with gravity) and the circuit board is abruptly caused to reverse direction, components held to the board by solder that has melted continue to travel in a substantially downward direction and are removed from the circuit board. Forces sufficient to impart greater velocity changes can also be used, but at some point, mechanical damage may be caused to the circuit components and/or to the board if too large an impulse is applied.

Figure 4:
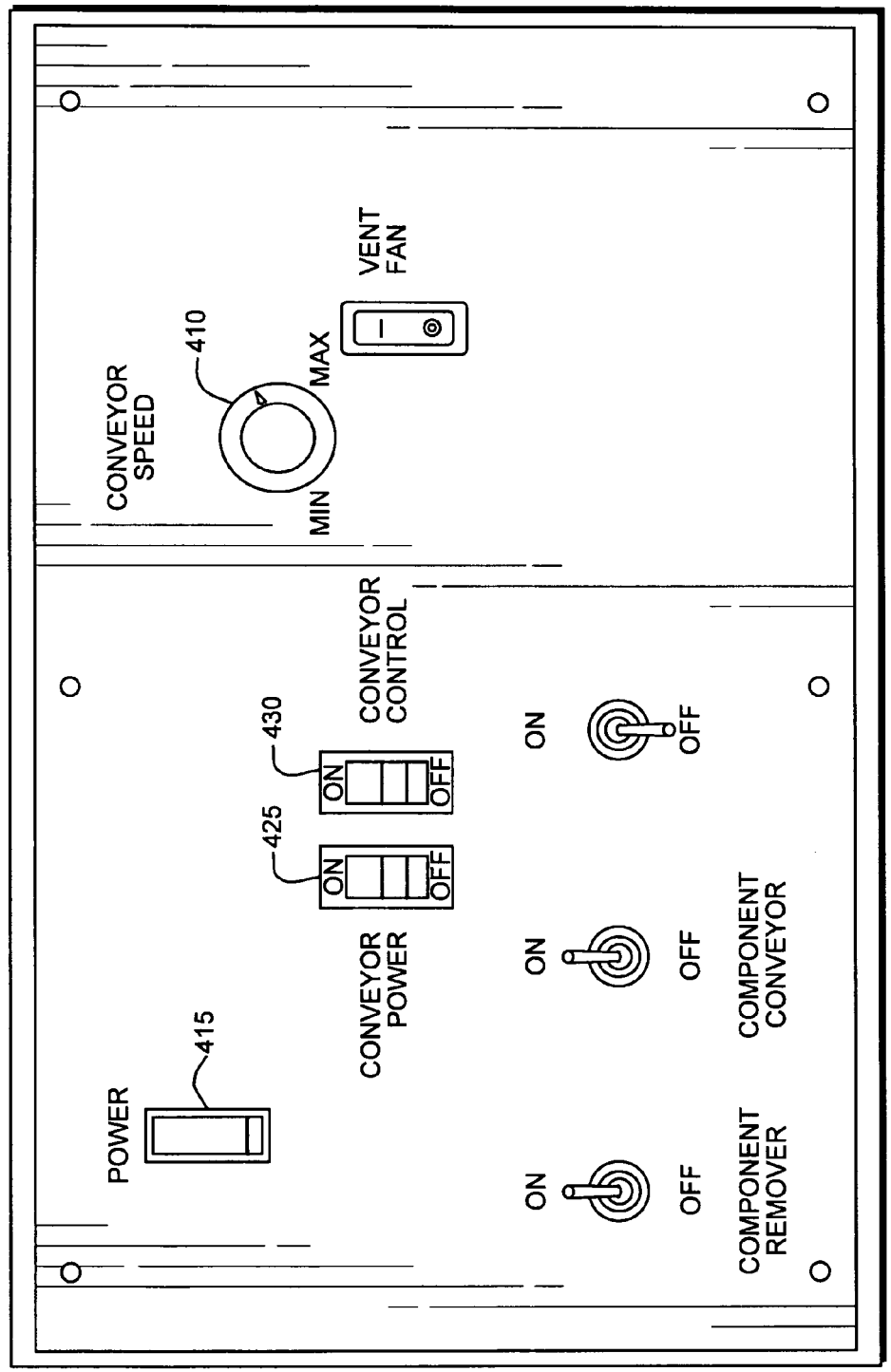
FIG. 4 is a view of an exemplary embodiment of a control panel used for controlling a circuit board conveyor, a vent, a component remover, and a component conveyor of an exemplary embodiment of a circuit board depopulation apparatus, according to the invention.

FIG. 4 is a view of an exemplary embodiment of the control panel 400 used for controlling a circuit board conveyor, a vent, a component remover, and a component conveyor of an exemplary embodiment of the circuit board depopulation apparatus 100. Control panel 400 includes various on-off switches and a variable speed control 410 that permits the setting of the conveyor speed between a minimum speed and a maximum speed. In one embodiment, the variable speed control 410 is operated by an operator, and once a suitable speed is set, the variable speed control 410 is left undisturbed. In various embodiments, the conveyor speed can be set over a range from 1 inch per minute of traverse speed to 48 inches per minute of traverse speed. It will be recognized that the speed of the conveyor 110 can be adjusted to be slow enough to permit sufficient heating of solder to occur to allow a circuit board to be depopulated, but not to provide such a long duration of heating that the circuit board is subjected to heat unnecessarily, e.g., for a duration so long that the circuit board is heated beyond a time when the last of the components to be removed from the circuit board have been removed. Variations in the numbers and physical dimensions of heaters can play a role in how rapidly the conveyor 110 may traverse, so long as the heating duration experienced by a circuit board is suitable.

In FIG. 4, there are shown a power switch 415 that controls power to all of the controls of control panel 400, an on-off switch 420 for p controlling power to the vent fan, an on-off switch 425 that control power to the conveyor, an on-off switch 430 that controls power to the conveyor speed control 410, an on-off switch 440 (labeled "component remover") that controls power to the one or more mechanical impact devices 360 that impart a vertical mechanical impact, and vertical motion, to a circuit board, an on-off switch that controls power to a conveyor for transporting removed components (labeled "component conveyor"), and an unassigned on-off switch 450.

Figure 5:
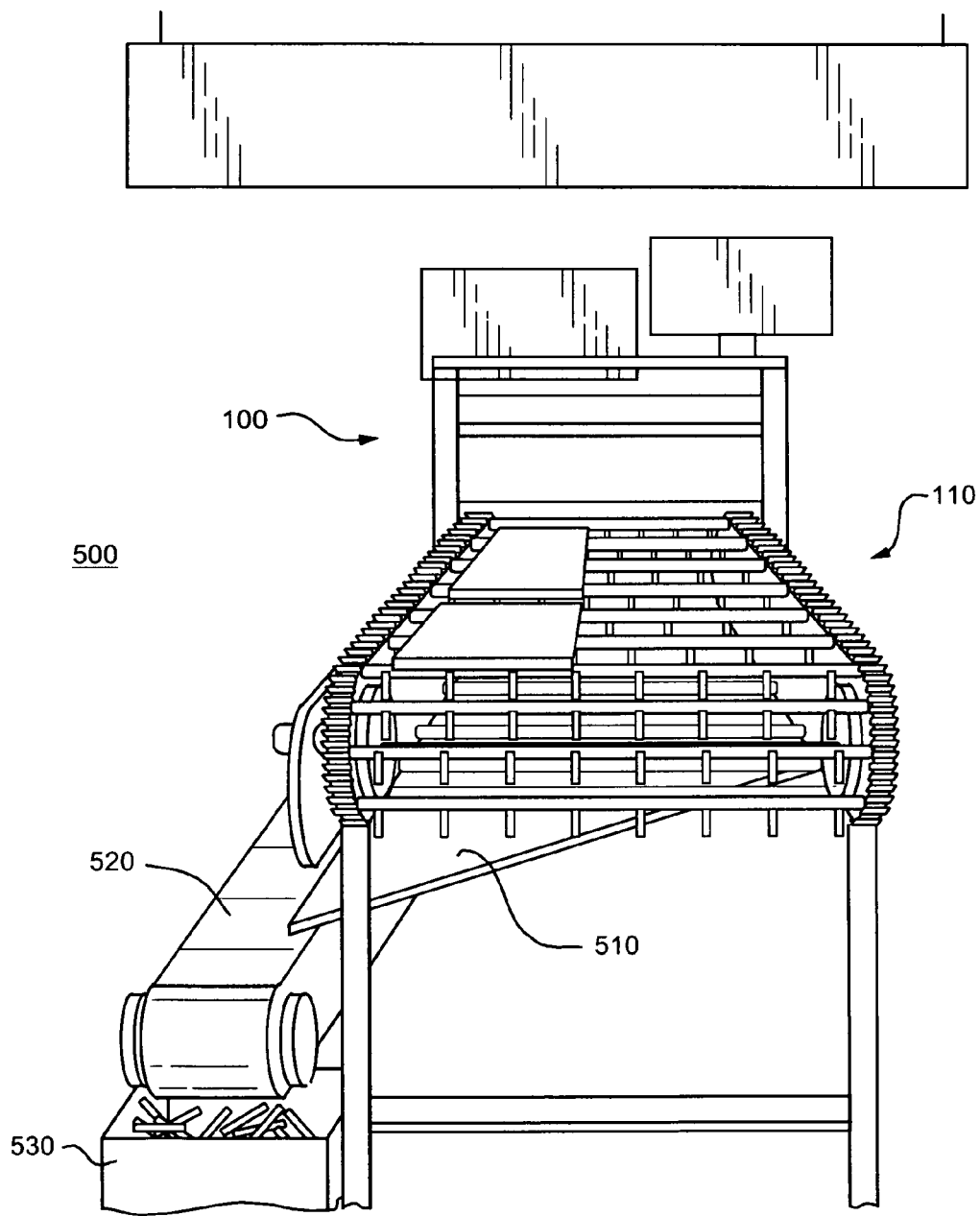
FIG. 5 is a view of the output portion of an exemplary embodiment of a circuit board depopulation apparatus, according to the invention.

FIG. 5 is a view of the output portion 500 of an exemplary embodiment of the circuit board depopulation apparatus 100. The end of circuit board depopulation apparatus 100 shown in FIG. 5 is an exit port of the apparatus. In FIG. 5, the conveyor 110 is moving substantially toward the viewer during a circuit board depopulation operation. In the embodiment depicted in FIG. 5, there is a surface 510 situated at an angle to the horizontal and oriented below the conveyor 110. Components that are removed from a circuit board passing through the circuit board depopulation apparatus 100 fall under the force of gravity until they reach surface 510, and then slide down surface 510 to a component conveyor 520 depicted at the left of the circuit board depopulation apparatus 100. The component conveyor 520 carries the components to a collection location 530, depicted in FIG. 5 as a bin. In the embodiment shown, component conveyor 530 carries components that have been removed from a circuit board in a direction substantially parallel to the direction of motion of conveyor 110. In other embodiments, component conveyor 530 carries components that have been removed from a circuit board in any convenient direction. In other embodiments, the components removed from a circuit board can be carried by the component conveyor 520 to a sorting station where components can be identified by features such as identification codes printed thereon, size, pin count, and other indicia so as to permit sorting of the components. The depopulated circuit board is carried by the conveyor 110 to a point where it is discharged from the circuit board depopulation apparatus 100. In the embodiment depicted in FIG. 5, the depopulated circuit board simply falls into a bin when it reaches the end of the conveyor 100. In other embodiments, the depopulated circuit board can be handled with more particularity, for example sorted according to some characteristic, such as size, model, or known or expected material content.

Figure 6:
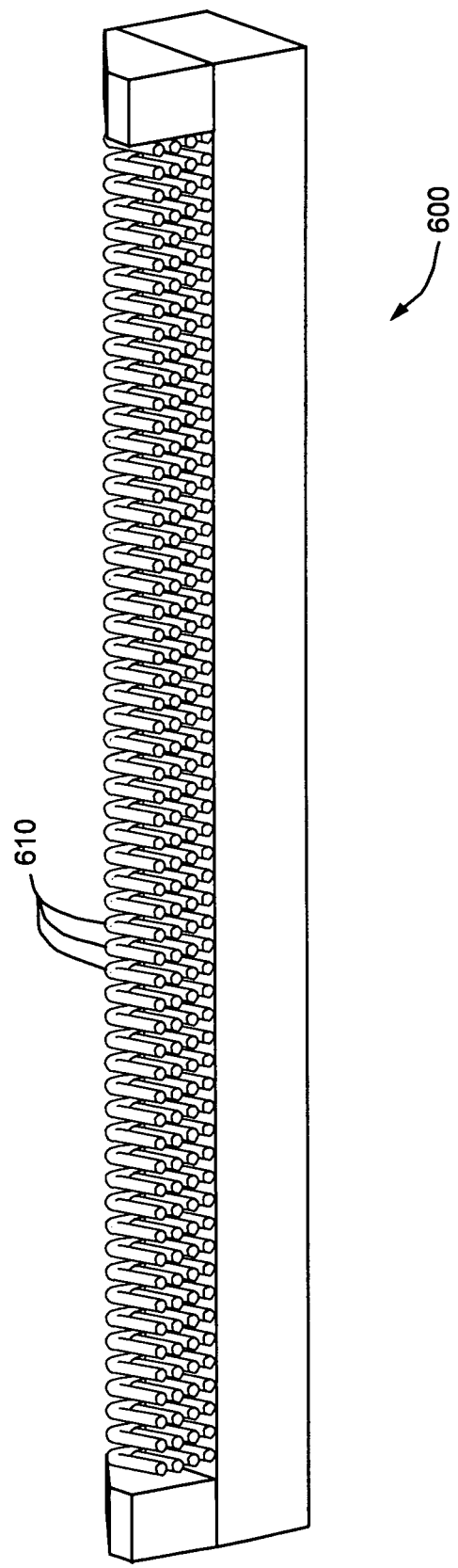
FIG. 6 is a first view of a multi-pin header that was removed from a circuit board using the systems and methods of the invention.

FIG. 6 is a first view of a multi-pin header 600 that was removed from a circuit board using the systems and methods of the invention. In this view, the multiple pins of the multi-pin header 600 that were soldered to a circuit board are seen to be undistorted and to be relatively clean and free of excess solder. The multi-pin header 600 comprises approximately 180 distinct pins 610, none of which appear to have suffered any harm. The multi-pin header 600, while used, appears to be completely serviceable and suited for use in assembling a fully functional circuit board. In short, the multi-pin header 600 appears to have been salvaged from the circuit board to which it was originally assembled.

Figure 7:
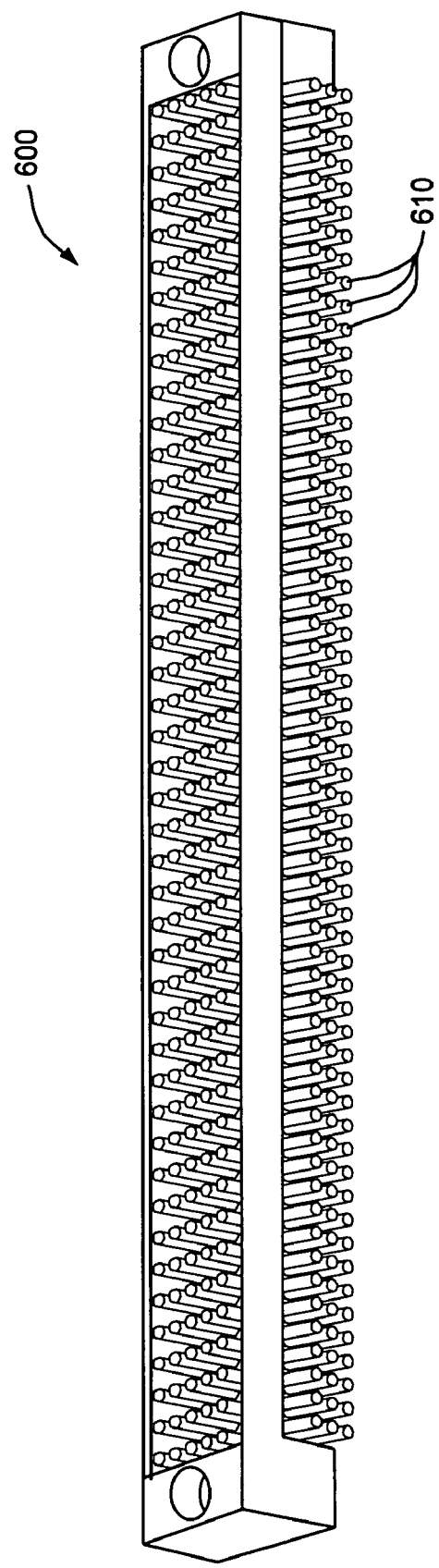
FIG. 7 is a second view of a multi-pin header that was removed from a circuit board using the systems and methods of the invention.

FIG. 7 is a second view of the multi-pin header 600 that was removed from a circuit board using the systems and methods of the invention. In this view, one sees the non-solder mechanical connection portion of the multi-pin header 600, as well as the ends of the pins 610 intended to be soldered. It is apparent that the multi-pin header 600 has not suffered any mechanical distortion, and is suitable for reuse. This connector is simply one example of a component that can be, and has been, successfully removed from a circuit board intended to be depopulated. The systems and methods of the invention allow many different kinds of components to be removed and recovered successfully, and in conditions suitable for reuse, including connectors, semiconductor devices of many types in various configurations such as surface mount devices (SMDs), dual inline packages (DIPs), and single inline packages (SIPs), resistors, capacitors, switches, and other components.

Figure 8:
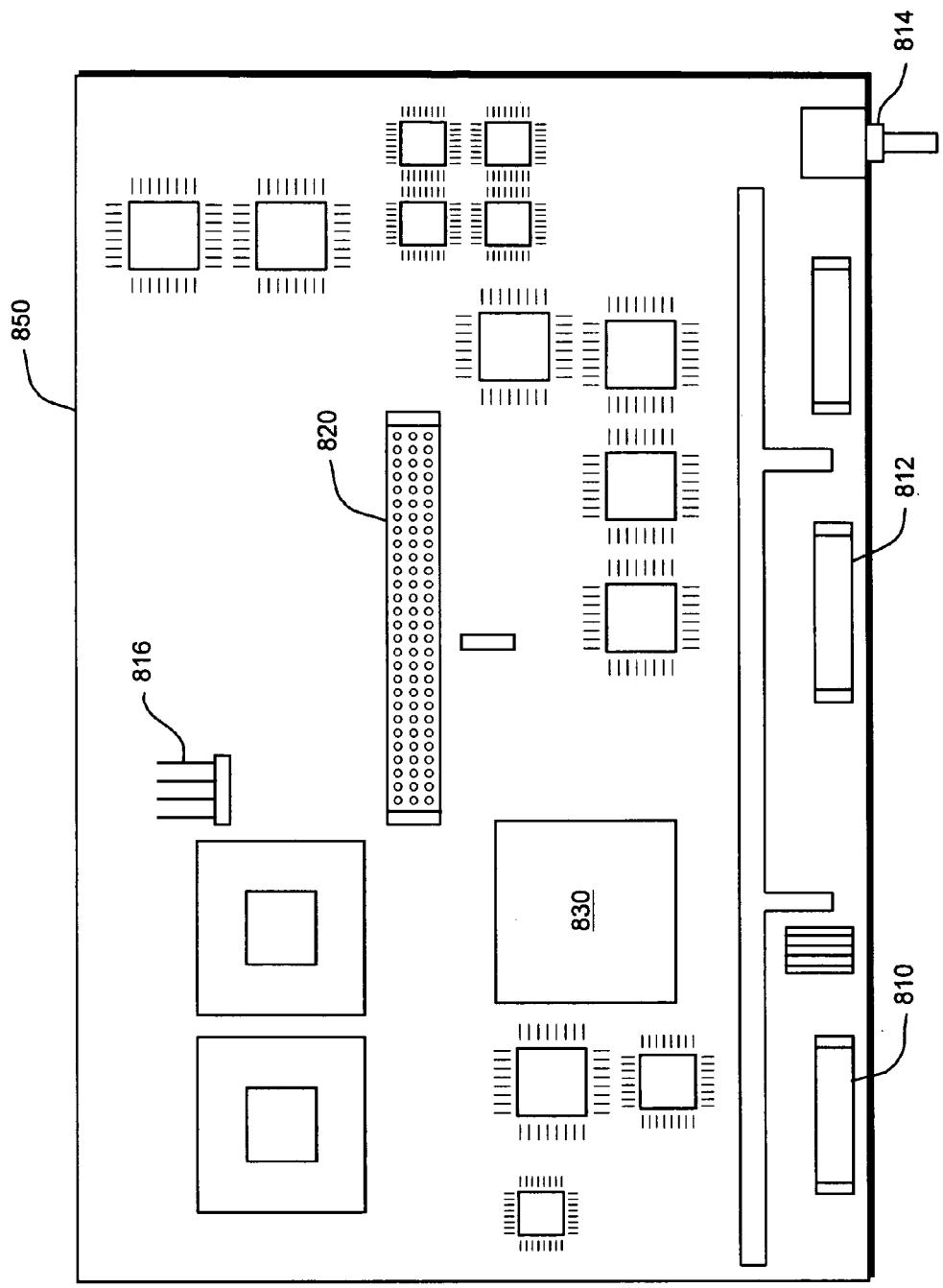
FIG. 8 is a view of a first side of a printed circuit board that was depopulated using the systems and methods of the invention.

FIG. 8 is a view of a first side of a printed circuit board 800 that was depopulated using the systems and methods of the invention. Printed circuit board 800 is a board of substantial size that was populated with numerous components. The apparatus in one embodiment is configured to handle boards of at least 6 inches on a side, and having maximum dimensions of 18 inches by 24 inches. In other embodiments, boards of any convenient size can be accommodated. In FIG. 8, one can observe several components 810, 812, 814, 816 that are attached to the printed circuit board with mechanical fasteners such as screws. As can be understood, the components 810, 812, 814, 816 that are held to the board with screws are not removed by being processed in the circuit board depopulation apparatus 100. Also shown in FIG. 800 are two large components, elongated component 820, and square component 830, that are attached to the circuit board 800 with solder that were not removed successfully during a processing pass through the circuit board depopulation apparatus 100.

Figure 9:
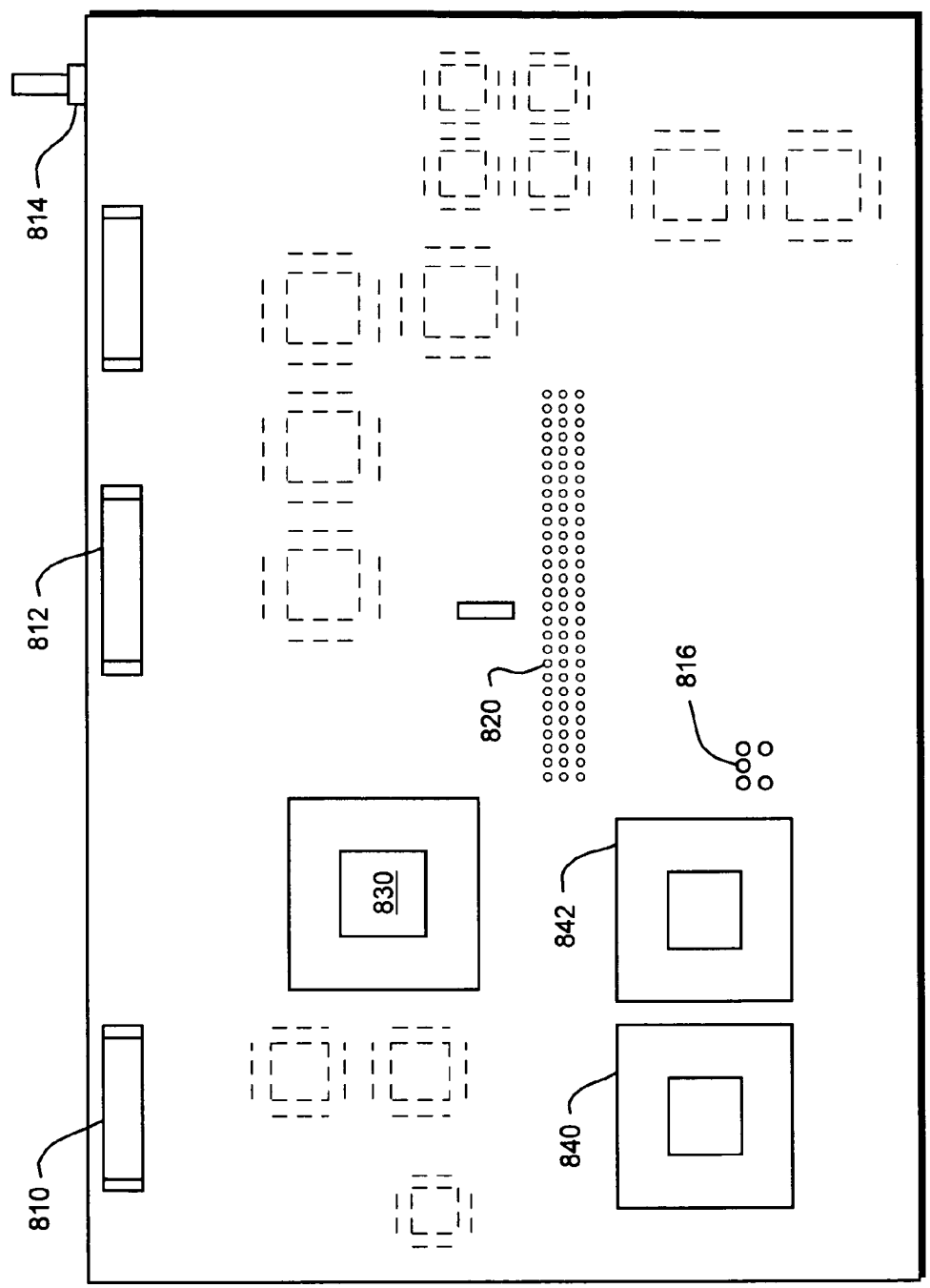
FIG. 9 is a view of a second side of a printed circuit board that was depopulated using the systems and methods of the invention.

FIG. 9 is a view of a second side of the printed circuit board 800 that was depopulated using the systems and methods of the invention. One observes that the components 820, 830 that were not removed successfully still appear to retain a few of the solder connections to the circuit board 800. The elongated component 820 shows that the solder holding he pins at its rightmost end was removed (note the open holes), while a number of solder connections near the middle of the elongated component were not successfully removed, thereby retaining the elongated component 820 to the circuit board. Observation of the area in which square component 830 is situated shown that most of the pins of square component 830 have been desoldered, and only a few pins still remain soldered to the circuit board, which few pins are sufficient to prevent the dislodging of square component 830. As may be seen, two other square components 840, 842 were successfully removed from the circuit board 800, and the openings in the circuit board 800 associated with square components 840, 842 are readily seen to be open and free of solder, indicative of complete melting of the solder used to connect those components 840, 842 to the circuit board 800. The system provides both integrated circuit and other soldered components. Parts that are removed from printed circuit board that have no value for resale can be aggregated for ease of processing to recover valuable materials.

Figure 10:
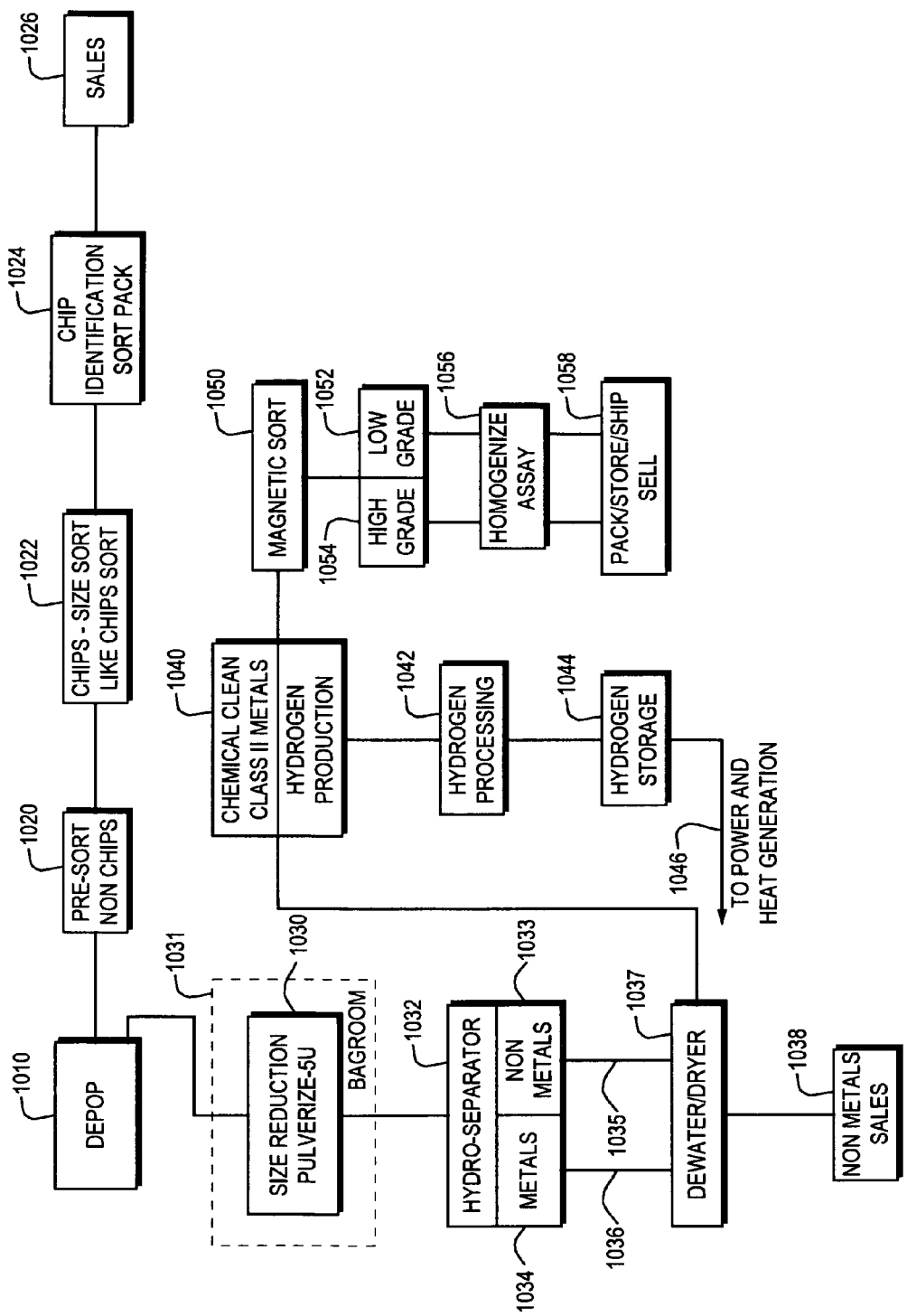
FIG. 10 is a flow diagram showing components of the systems and methods of the invention, including various processes and systems for depopulating circuit boards, recovering valuable materials, and recovering energy, according to the invention.

FIG. 10 is a flow diagram 1000 showing components of the systems and methods of the invention, including various processes and systems for depopulating circuit boards 1012, recovering valuable materials 1020-1026, 1030-1038, 1040, 1050-1058 and recovering energy 1042-1046, according to the invention. Box 1010 denotes both the circuit board depopulation apparatus 100 and methods of operating that apparatus to separate components from circuit boards. Several streams emanate from the depopulation process 1010. One stream represents a flow of components removed from circuit boards, as denoted by boxes 1020-1026. Box 1020 represents the removal and sorting as necessary of non-chip (e.g., non-semiconductor) components, such as connectors and switches, that can be salvaged for reuse. Box 1022 denotes the sorting of chip components (e.g., semiconductors), which sorting can be performed by size, for example. Box 1024 denotes the identification of specific types of chips, including further sorting of chips, for example by identification based on codes affixed to the chips, and packaging of chips by sorted type. Box 1026 denotes that the components sorted and collected in the processes identified by boxes 1020, 1022, and 1024 are made available for sale.

Boxes 1030-1038 denote a second stream of output from the circuit board depopulation apparatus and methods denoted by box 1010. In this stream, the depopulated circuit boards are subjected to a size reduction process 1030, which may take place in a bag room 1031. The size reduction process 1030 can be performed by any convenient grinding, crushing or milling apparatus. In one embodiment, the depopulated circuit boards are converted to particulate matter having a preferred size measured in hundredths of inches. The resulting particulate matter is separated, for example by a hydro-separator 1032 of conventional type, into less dense non-metallic components 1033 and more dense metallic components 1034. The two streams, nonmetallic stream 1035 and metallic stream 1036, are dried by having water drained therefrom and otherwise dried, for example by air drying, or drying with heat. The nonmetallic components are then prepared for sale, as indicated by box 1038.

The metallic component, after drying/dewatering, is passed to another processing sequence. At box 1040, denoting a processing step in which metallic constituents are chemically cleaned, and in which certain metals, such as aluminum, are reacted with bases such as KOH or NaOH to generate hydrogen, more reactive metals are separated from less reactive metals. The hydrogen produced is process at box 1042, is stored as needed as denoted by box 1044, and is provided for use in generation of power and heat at 1046, for example by combustion, by being used in fuel cells, or by being used in chemical processing.

At box 1050, the residue of the chemical cleaning is sorted, for example by magnetic sorting to separate ferromagnetic metals from diamagnetic metals. In addition, metal oxides, such as aluminum oxide, can be recovered from the chemical cleaning solution, for example by evaporating the solution. At box 1052 the low grade metals are recovered, and at box 1054 the high grade metals (such as precious metals gold, platinum, palladium, and other precious metals) are recovered. The metals optionally can be assayed, as denoted by box 1056. The recovered metals are then packaged for sale, as denoted by box 1058.

Machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A method of producing a removed item originally soldered to a printed circuit board, the printed circuit board readily absorbing infrared energy at a certain set of wavelengths, said method comprising the steps of:

transporting said printed circuit board containing the soldered item to be removed from a printed circuit board entry port to a printed circuit board exit port of an apparatus configured to remove said item;

controlling a travel speed of said printed circuit board;

heating a solder of the item to be removed, by applying to the printed circuit board containing the soldered item to be removed, infrared radiation at one or more selected wavelengths different from the certain wavelengths that are readily absorbed by said printed circuit board, the one or more selected wavelengths applied being readily absorbed by the solder and having sufficient energy to melt the solder of the item to be removed, the one or more selected wavelengths applied being not readily absorbed by the printed circuit board, such that the printed circuit board exits the exit port of the apparatus at a temperature that can be grasped with a bare hand;

applying mechanical forces to the printed circuit board having the melting solder of the item to be removed situated between said printed circuit board entry port and said printed circuit board exit port of said apparatus;

controlling an amplitude of the mechanical forces applied to the printed circuit board;

catching at least one item that becomes disconnected from the printed circuit board; and transporting to a first collection location said disconnected item under the influence of gravity;

whereby said printed circuit board bearing said item soldered thereto is separated from said item when said printed circuit board bearing said item is transported from said entry port to said exit port under the steps of being heated and having mechanical forces applied thereto, wherein the step of transporting the printed circuit board from the printed circuit board entry port to the printed circuit board exit port of the apparatus is completed in approximately 8-12 seconds.

2. The method of claim 1, wherein the step of heating is completed before the step of applying mechanical forces to the printed circuit board commences.

3. The method of claim 1, wherein the step of applying mechanical forces includes:

vertically displacing the printed circuit board in an upward direction;

arresting vertical displacement of the printed circuit board;

allowing gravity to displace the painted circuit board in a downward direction; and abruptly causing the circuit board to reverse direction such that said item separates from said printed circuit board.

4. The method of claim 1, wherein the item to be removed is a through hole mount electronic component.

5. A method of producing a removed item originally soldered to a printed circuit board, wherein said printed circuit board readily absorbs infrared energy at a certain set of wavelengths, said method comprising the steps of:

transporting said printed circuit board containing the soldered item to be removed from a printed circuit board entry port to a printed circuit board exit port of an apparatus configured to remove said item;

controlling a travel speed of said printed circuit board;

heating a solder of the item to be removed, by applying to the printed circuit board containing the soldered item to be removed infrared radiation at one or more selected wavelengths other than the certain wavelengths that are readily absorbed by the printed circuit board, the one or more selected wavelengths applied being readily absorbed by the solder to melt the solder of the item to be removed, the one or more selected wavelengths applied being not readily absorbed by the printed circuit board;

applying mechanical forces to the printed circuit board having the melting solder of the item to be removed situated between said printed circuit board entry port and said printed circuit board exit port of said apparatus, wherein the step of applying mechanical forces includes;

vertically displacing the printed circuit board in an upward direction;

arresting vertical displacement of the printed circuit board;

allowing gravity to displace the printed circuit board in a downward direction; and abruptly causing the printed circuit board to reverse direction such that said item separates from said printed circuit board.

6. A method of producing a removed item originally soldered to a printed circuit board, the printed circuit board readily absorbing infrared energy at a certain set of wavelengths, said method of producing the removed item comprising the steps of:

transporting the printed circuit board containing the soldered item to be removed from a printed circuit board entry port to a printed circuit board exit port of an apparatus configured to remove the item;

controlling a travel speed of the printed circuit board during transport;

heating a solder of the item to be removed, by selecting radiating via an infrared heater operating at substantially a 1300 degree Fahrenheit color temperature, infrared energy at a tuned wavelength sufficient to melt the solder without substantially radiating infrared energy at the certain set of wavelengths such that the printed circuit board exits the exit port of the apparatus at a temperature that can be grasped with a bare hand;

applying mechanical forces to the printed circuit board having the melting solder of the item to be removed situated between said printed circuit board entry port and said printed circuit board exit port of said apparatus;

controlling an amplitude of the mechanical forces applied to the printed circuit board;

catching at least one item that becomes disconnected from the printed circuit board; and transporting to a first collection location said disconnected item under the influence of gravity;

whereby said printed circuit board bearing said item soldered thereto is separated from said item when said printed circuit board bearing said item is transported from said entry port to said exit port under the steps of being heated and having mechanical forces applied thereto.

* * * * *